United States Patent
Schroers et al.

(10) Patent No.: US 11,719,770 B2
(45) Date of Patent: Aug. 8, 2023

(54) MULTI-FUNCTIONAL MAGNETIC TEST STRUCTURE FOR XMR SENSORS

(71) Applicant: Infineon Technologies AG, Neubiberg (DE)

(72) Inventors: Christoph Schroers, Villach (AT); Manfred Steiner, Rennweg am Katschberg (AT); Armin Winkler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 668 days.

(21) Appl. No.: 16/590,985

(22) Filed: Oct. 2, 2019

(65) Prior Publication Data

US 2021/0103014 A1 Apr. 8, 2021

(51) Int. Cl.
*G01R 33/09* (2006.01)
*G01R 33/028* (2006.01)
*G01R 33/07* (2006.01)
*G01R 33/00* (2006.01)

(52) U.S. Cl.
CPC ....... *G01R 33/091* (2013.01); *G01R 33/0283* (2013.01); *G01R 33/07* (2013.01); *G01R 33/0017* (2013.01)

(58) Field of Classification Search
CPC ............ G01R 33/0017; G01R 33/0035; G01R 33/0283; G01R 33/07; G01R 33/091; G01R 33/09
See application file for complete search history.

(56) References Cited

U.S. PATENT DOCUMENTS

| | | | | |
|---|---|---|---|---|
| 2009/0212770 A1* | 8/2009 | Koyama | ................ | G01R 33/09 324/249 |
| 2013/0009659 A1* | 1/2013 | Liu | .................... | G01R 1/07307 324/756.02 |
| 2015/0346290 A1* | 12/2015 | Holm | ..................... | G01R 33/09 324/202 |
| 2018/0372810 A1* | 12/2018 | Jiang | .................. | G01R 33/0035 |
| 2019/0346515 A1* | 11/2019 | Motz | ...................... | H10N 52/80 |

* cited by examiner

*Primary Examiner* — Son T Le
*Assistant Examiner* — Adam S Clarke
(74) *Attorney, Agent, or Firm* — Harrity & Harrity, LLP

(57) ABSTRACT

A sensor die may include a set of sensing elements and a test structure associated with determining a magnetic sensitivity of the set of sensing elements. The test structure includes a first test sensing element sensitive in a direction in a plane defined by a surface of the sensor die, a second test sensing element sensitive in the direction in the plane defined by the surface of the sensor die, and a wire on chip (WoC) associated with applying a magnetic field to the first test sensing element and the second test sensing element. The first test sensing element, the second test sensing element, and the WoC may be arranged such that, when current flows through the WoC, the first test sensing element senses a component of the magnetic field in the direction, and the second test sensing element senses a component of the magnetic field in a perpendicular direction.

20 Claims, 8 Drawing Sheets

MULTI-FUNCTIONAL MAGNETIC TEST STRUCTURE FOR XMR SENSORS

BACKGROUND

A magnetic sensor may be capable of sensing one or more components of a magnetic field. The one or more components of the magnetic field may include, for example, a component of the magnetic field in a first direction on a plane defined by a sensor die (e.g., an x-component of the magnetic field), a component of the magnetic field in a second direction on the plane defined by the sensor die (e.g., a y-component of the magnetic field), and/or a component of the magnetic field in a direction that is perpendicular to the plane defined by the sensor die (e.g., a z-component of the magnetic field). Such magnetic field measurements may be used, for example, to detect a movement, a position, an angle of rotation, and/or the like, of an object (e.g., an object that applies the magnetic field or an object that is affixed to a magnet that applies the magnetic field), in a variety of applications, such as an automotive application, an industrial application, a consumer application, and many others. In some cases, the magnetic sensor may include a set of sensing elements for sensing the one or more components of the magnetic field, such as one or more magnetoresistive (MR)-based sensing elements (herein referred to as XMR elements).

SUMMARY

According to some implementations, a sensor die may include: a set of sensing elements; and a test structure associated with determining a magnetic sensitivity of the set of sensing elements, the test structure including: at least one first test sensing element sensitive in a first direction in a plane defined by a surface of the sensor die, at least one second test sensing element sensitive in the first direction in the plane defined by the surface of the sensor die, and a wire on chip (WoC) associated with applying a magnetic field to the at least one first test sensing element and to the at least one second test sensing element, wherein the at least one first test sensing element, the at least one second test sensing element, and the WoC are arranged such that when current flows through the WoC: a component of the magnetic field in the first direction is applied to the at least one first test sensing element, and a component of the magnetic field in a second direction that is perpendicular to the first direction is applied to the at least one second test sensing element senses.

According to some implementations, a device may include: one or more sensing elements; and a test structure associated with determining a magnetic sensitivity of the one or more sensing elements, the test structure including: a first set of test sensing elements sensitive in a direction in a plane defined by a sensor die, a second set of test sensing elements sensitive in the direction in the plane defined by the sensor die, and a conductive element associated with applying a magnetic field to the first set of test sensing elements and to the second set of test sensing elements, wherein the first set of test sensing elements, the second set of test sensing elements, and the conductive element are arranged such that, when current flows through the conductive element, a component of the magnetic field in the first direction is applied to the first set of test sensing elements, and a component of the magnetic field in a second direction is applied to the second set of test sensing elements, wherein the second direction is perpendicular to the first direction, and wherein the conductive element includes a first section arranged along a direction that is perpendicular to the first direction, and a second section arranged along a direction that is parallel to the first direction, wherein the first set of test sensing elements is arranged over the first section, and wherein the second set of test sensing elements is arranged over the second section.

According to some implementations, a method may include: providing a current to a conductive element of a test structure to cause a magnetic field to be applied to a set of test sensing elements of the test structure; measuring a magnetic sensitivity of a subset of test sensing elements, of the set of test sensing elements, after providing the current to the conductive element; and determining a magnetic sensitivity of a set of sensing elements based at least in part on the magnetic sensitivity of the subset of test sensing elements, wherein the test structure and the set of sensing elements are on a same sensor die.

DETAILED DESCRIPTION

The following detailed description of example implementations refers to the accompanying drawings. The same reference numbers in different drawings may identify the same or similar elements.

A sensing element, such as an XMR element, may be sensitive to an in-plane magnetic field. That is, the sensing element may be magnetized such that the sensing element is sensitive to a component of a magnetic field in a direction on a plane defined by a surface of a sensor die on or in which the sensing element is arranged. Depending on the manufacturing process, the sensitive direction of the sensing element may be designed to be aligned with an x-component of a magnetic field (sometimes referred to as a $B_x$ component) or a y-component of the magnetic field (sometimes referred to as a $B_y$ component).

Magnetic sensitivity may vary among magnetic sensors that include sensing elements such as XMR elements. This variation in magnetic sensitivity may depend on, for example, a fabrication technology used to fabricate the sensing elements, a temperature during fabrication, and/or one or more other factors associated with fabrication of the sensing elements. Therefore, tuning a magnetic threshold of a given magnetic sensor may be needed when the magnetic sensor needs to meet a particular requirement (e.g., a data sheet limit) of an application in which the magnetic sensor is to be used. Such tuning may be achieved by, for example, laser fuse trimming or electrically erasable programmable read-only memory (EEPROM) configuration. To measure an actual magnetic sensitivity of the given magnetic sensor, a magnetic field is applied to the magnetic sensor, and a response of the magnetic sensor is measured. The measurement of the actual magnetic sensitivity is typically performed during a productive test routine.

Figure 1:
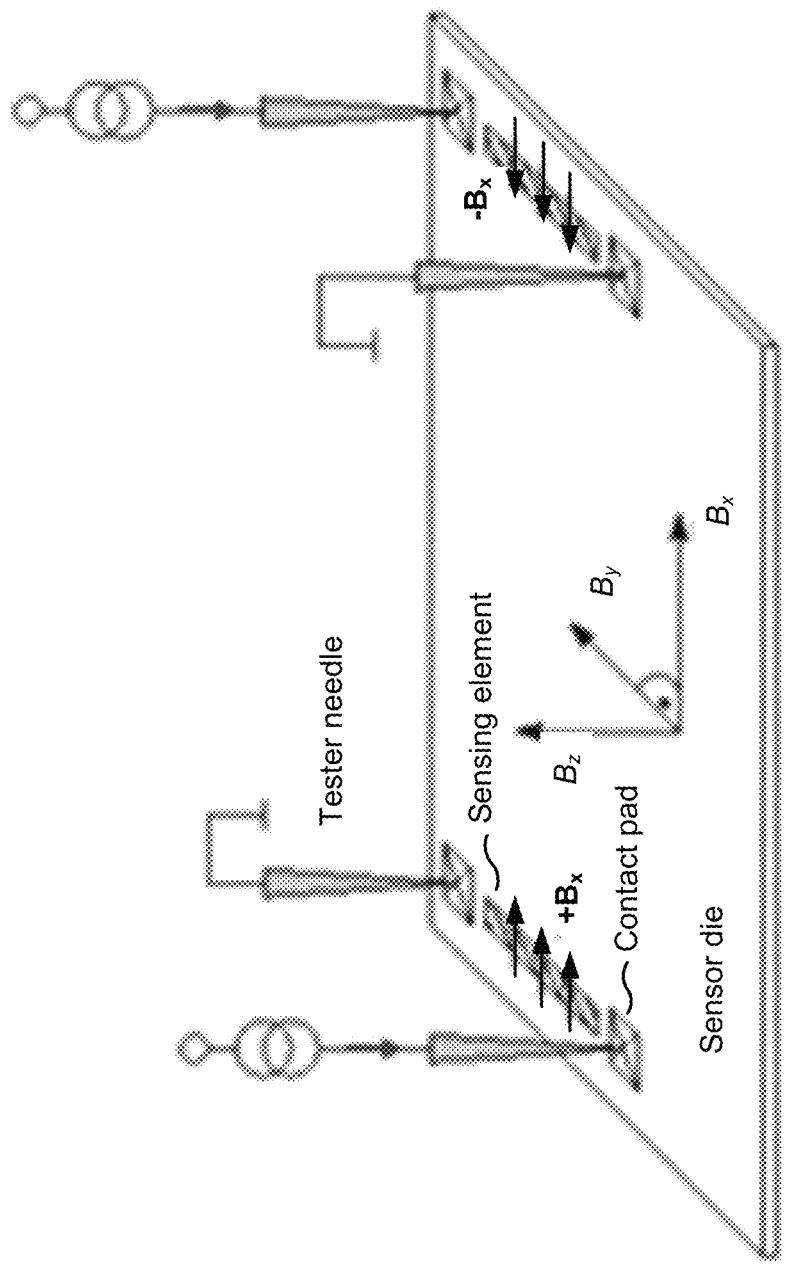
FIG. 1 is a diagram illustrating an example configuration of a conventional sensor die.

FIG. 1 illustrates an example of a conventional sensor die including a pair of sensing elements (e.g., XMR sensing elements) and conductive elements, arranged below the sensing elements, that can be used in association with determining a magnetic sensitivity of the magnetic sensor. In the example shown in FIG. 1, the sensing elements are sensitive in the $B_x$ direction. Although not visible in FIG. 1, each of the conductive elements (individually referred to as a Wire on Chip (WoC)) is arranged below one of the sensing elements (e.g., along a length of the XMR sensing element in a direction parallel to the $B_y$ direction). As further shown, test pads are arranged at ends of the conductive elements such that current (I) can be applied to the conductive elements (e.g., via tester needles). A known magnetic field is applied to the sensing elements by conducting a defined current through the conductive elements, and the magnetic sensitivity of the magnetic sensor can be determined based on an output of the magnetic sensor in response to the application of the known magnetic field.

However, there are numerous disadvantages associated with the conventional sensor die shown in FIG. 1. For example, while the conventional sensor die shown in FIG. 1 can be used when the sensing elements are sensitive in the $B_x$ direction, such a configuration cannot be used when the sensing elements are sensitive in the $B_y$ direction (since the direction of sensitivity would be parallel to the in-plane component of the applied magnetic field). Further, the inclusion of the conductive elements below the sensing elements may limit usage of area below the sensing elements (i.e., area that could otherwise be used for other circuitry is unusable due to the presence of the conductive elements), meaning that die area utilization is not optimized. Similarly, an amount of area consumed by the test pads may be undesirable, particularly as size restrictions require further miniaturization. Furthermore, a width of the conductive elements, which may match that of the sensing elements, results in a poor coil constant in the conductive elements and, therefore, an amount of current needed to apply the magnetic field to the sensing elements is increased.

Another conventional sensor die configuration that can be used in association with measuring a magnetic sensitivity of a magnetic sensor includes a conductive element that is arranged diagonally below the sensing element (e.g., at a 45 degree angle with respect to a length of the sensing element). While such a configuration can be used whether the sensing element is sensitive in the $B_x$ direction or the $B_y$ direction, the same disadvantages described above are present, such as sub-optimal die area utilization, undesirable test pad area consumption, and a poor coil constant. In fact, in this alternative conventional sensor die configuration, the coil constant is worsened due to the diagonal arrangement, meaning that the amount of current needed to apply the magnetic field is further increased (as compared to the example conventional sensor die configuration described above).

Some implementations described herein provide a multi-functional magnetic test structure for a magnetic sensor, such as an XMR sensor. In some implementations, the multi-functional magnetic test structure (herein referred to as a test structure) may be arranged on a sensor die along with a set of sensing elements (i.e., sensing elements to be used by the magnetic sensor in a given application), and may be used in association with determining a magnetic sensitivity of the set of sensing elements. In some implementations, as described in further detail below, the test structure enables measurement of the sensitivity of the set of sensing elements indirectly (i.e., by measuring the magnetic sensitivity of the magnetic sensor using the test structure, rather than the set of sensing elements).

In some implementations, the test structure may include a first set of test sensing elements and a second set of test sensing elements, each of which is sensitive in a first direction in a plane defined by a surface of the sensor die (e.g., the $B_x$ direction or the $B_y$ direction). The test structure may further include a conductive element (e.g., a WoC) associated with applying a magnetic field to the first and second sets of test sensing elements. Within the test structure, the first set of test sensing elements, the second set of test sensing elements, and the conductive element may be arranged such that when current flows through the conductive element a component of the magnetic field in the first direction (e.g., a $B_x$ component) is applied to the first set of test sensing elements, and such that a component of the magnetic field in a second direction that is perpendicular to the first direction (e.g., a $B_y$ component) is applied to the second set of test sensing elements. Here, the magnetic sensitivity of either the first or second set of test sensing elements, and therefore the magnetic sensitivity of one or more other sensing elements on the sensor die, can be measured.

In some implementations, the test structure may be placed at a convenient or desirable position on the sensor die (e.g., a position away from the set of sensing elements, a position near an edge of the sensor die, and/or the like). Further, the test structure may be sized to consume a relatively small area (e.g., as compared to the set of sensing elements that are dimensioned for low noise, offset, and/or the like). Thus, the test structure described herein resolves the location, arrangement, and size-related issues associated with the above-described conventional sensor die configurations.

Additionally, as described in further detail below, the test structure described herein enables measurement of the magnetic sensitivity regarding whether the set of sensing elements are sensitive in the $B_x$ direction or in the $B_y$ direction. Further, because the test structure can be arranged in any convenient area of the sensor die and has a relatively small footprint, die area utilization is improved (as compared to the conventional sensor dies described above). Thus, areas close to the sensing elements may be utilized for other application relevant circuits (e.g., a low noise amplifier (LNA), an analog-to-digital converter (ADC), and/or the like). Additionally, because the test structure is relatively small, a width of the conductive elements may be reduced, meaning that a coil constant of the conductive elements is improved and, therefore, that an amount of current needed to apply the magnetic field to the test structure is decreased.

Furthermore, in some implementations, one or more elements of the test structure can provide one or more other functions. For example, in some implementations, the test structure can be used for measurement of a single ended homogeneous magnetic field (e.g., in a final packaged sensor device when the test pads are no longer accessible from the outside). As another example, a conductive element of the test structure can be used as a ground connection or a power connection by another circuit of the sensor die. As another example, a ground pad of the test structure may also serve as a ground pad for the sensor die.

FIGS. 2A-2E are diagrams associated with an example implementation of a sensor die 200 including a test structure 202.

Figure 2A:
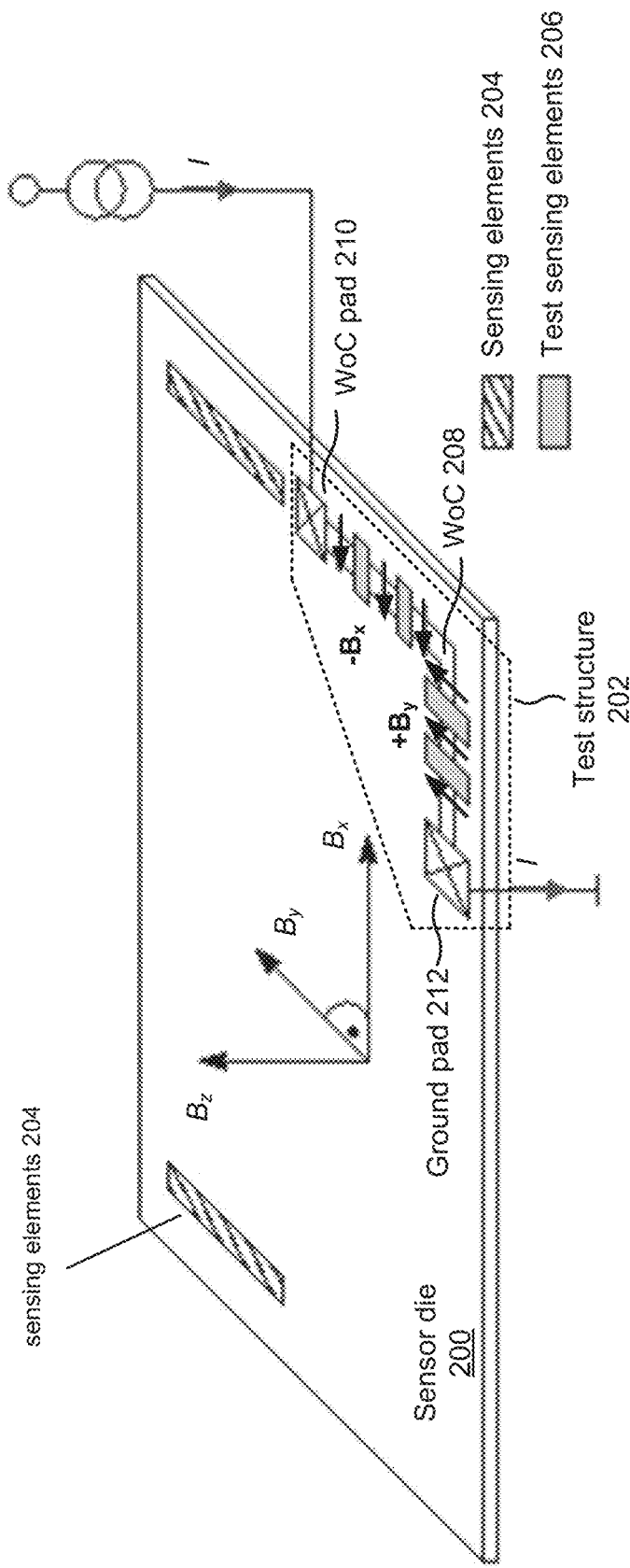
FIGS. 2A-2E are diagrams associated with an example implementation of a sensor die including a test structure described herein.

Test structure 202 includes a structure associated with determining a magnetic sensitivity of sensing elements 204 of sensor die 200, as described herein. As shown, test structure 202 may include multiple test sensing elements 206 (e.g., a first set of test sensing elements 206 and a second set of test sensing elements 206), a WoC 208, a WoC pad 210, and a ground pad 212. Additional details regarding the arrangement and function of elements of test structure 202 are described below in association with FIG. 2B. As indicated in FIG. 2A, a position of test structure 202 on sensor die 200 does not depend on a position of sensing elements 204 and, therefore, test structure 202 can be arranged at a desirable or convenient position (e.g., a position away from sensing elements 204, a position at or near an edge of sensor die 200, and/or the like), which may improve die area utilization by, for example, allowing die areas close to sensing elements 204 to be utilized for other application relevant circuits, and/or allowing test structure 202 to be arranged at an otherwise unused location on the sensor die. Further, the location of test structure 202 can, in some implementations, be selected in order to enable one or more other functions, such as homogenous magnetic field monitoring, as described below.

In some implementations, a magnetic sensitivity of a set of test sensing elements 206 (e.g., one or more test sensing elements 206) may be measured, and the magnetic sensitivity of sensing elements 204 can be determined based at least in part on magnetic sensitivity of the set of test sensing elements 206. In some implementations, resistor matching of the set of test sensing elements 206 (i.e., determining whether a resistance of the test sensing elements 206 matches a resistance of the set of sensing elements 204) can be tested chip-fine in a front-end wafer test. When resistor matching is found (which is likely because the test sensing elements 206 and the sensing elements 204 are fabricated at the same time, using the same procedure, and on the same sensor die 200), the magnetic sensitivity of sensing elements 204 can be reliably determined based on the magnetic sensitivity of the set of test sensing elements 206. FIG. 2D is a diagram illustrating an example of implementation of test structure 202 when configured for performing resistor matching of the set of test sensing elements 206. As indicated in FIG. 2D, in some implementations, the resistor matching of the set of test sensing elements 206 may be performed using a homogeneous magnetic field (e.g., a magnetic field having a component in a single direction only) because such fields are relatively simple to generate. Additional details regarding a process for operation and use of test structure 202 are described below with regard to FIG. 3.

Returning to FIG. 2B, Sensing element 204 includes an element capable of sensing a component of a magnetic field present at sensor die 200. For example, sensing element 204 may be an XMR element that comprises a magnetoresistive material (e.g., nickel-iron (NiFe)), where the electrical resistance of the magnetoresistive material may depend on a strength and/or a direction of the magnetic field present at the magnetoresistive material. Here, sensing element 204 may operate based on, for example, an anisotropic magnetoresistance (AMR) effect, a giant magnetoresistance (GMR) effect, a tunnel magnetoresistance (TMR) effect, and/or the like. As another example, sensing element 204 may include a Hall-based sensing element (e.g., a vertical Hall sensing element) that operates based on a Hall effect, in some implementations. Sensing elements 204 of sensor die 200 may be magnetized in a particular direction such that the sensing elements 204 are sensitive along the particular direction (e.g., such that a resistance of sensing element 204 depends on a strength of a component of a magnetic field in the particular direction). In some implementations, each sensing element 204 of sensor die 200 may be sensitive in a same direction. For example, sensing elements 204 of sensor die 200 may be magnetized such that each sensing element 204 is sensitive in the $B_x$ direction (e.g., such that sensing element 204 is sensitive to the $B_x$ component of a magnetic field) or such that each sensing element 204 is sensitive in the $B_y$ direction (e.g., such that sensing element 204 is sensitive to the $B_y$ component of a magnetic field). In some implementations, sensing elements 204 of sensor die 200 may be arranged in a bridge configuration (e.g., to provide differential sensing).

Figure 2B:
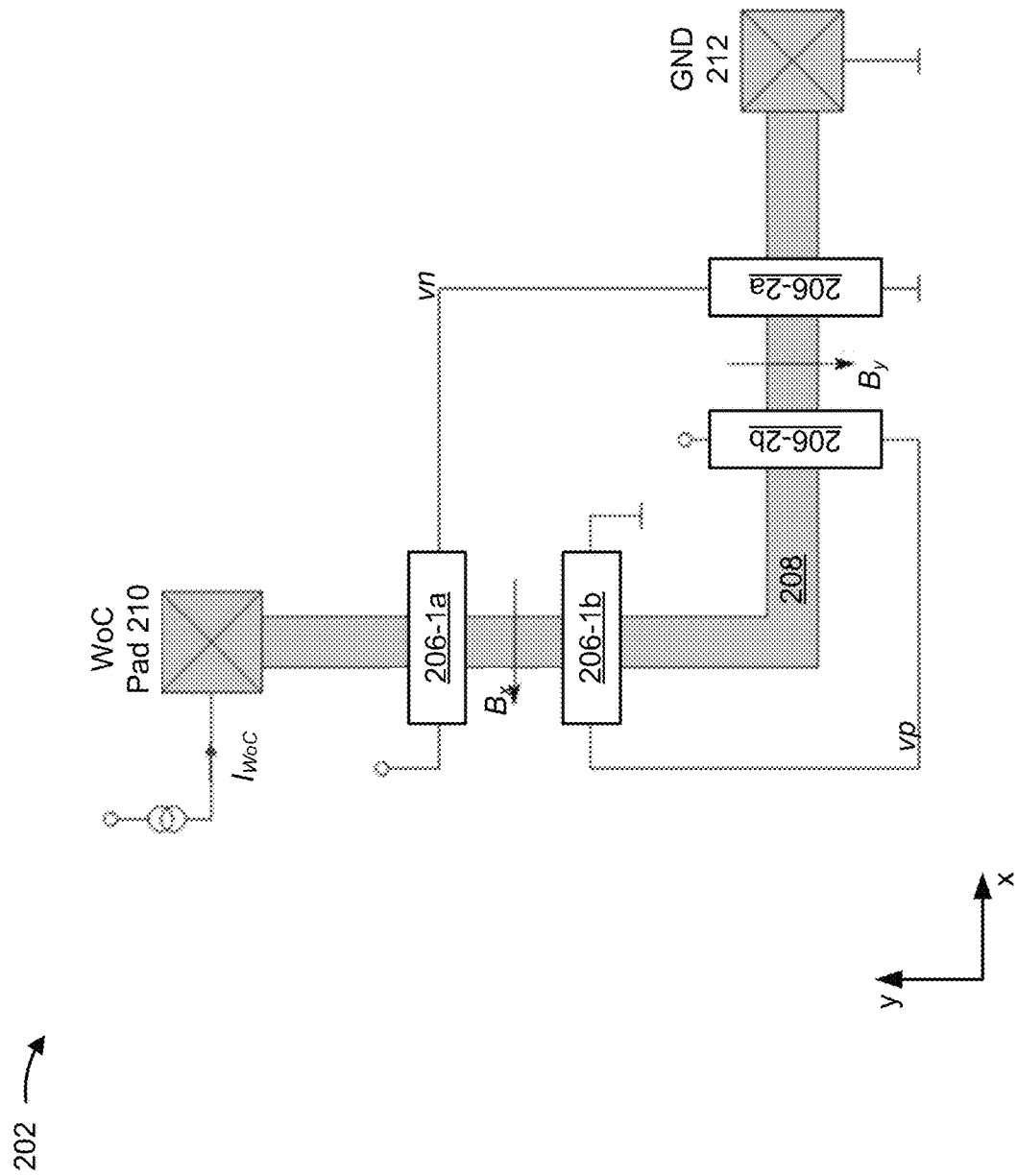

FIG. 2B is a diagram illustrating test structure 202 comprising sets of test sensing elements 206 (e.g., a first set of test sensing elements 206 including test sensing element 206-1a and test sensing element 206-1b, and a second set of test sensing elements 206 including test sensing element 206-2a and test sensing element 206-2b), WoC 208, WoC pad 210, and ground pad 212.

Test sensing element 206 includes an element, included in test structure 202, that is capable of sensing a component of a magnetic field (e.g., in a direction on a plane defined by a surface of sensor die 200) in association with determining a magnetic sensitivity of sensing elements 204 of sensor die 200. For example, test sensing element 206 may be an XMR element that comprises a magnetoresistive material, and may operate based on an AMR effect, a GMR effect, a TMR effect, and/or the like. As another example, test sensing element 206 may include a Hall-based sensing element that operates based on a Hall effect, in some implementations.

In some implementations, each test sensing element 206 of sensor die 200 may be sensitive in a same direction. For example, in the example shown in FIG. 2B, each test sensing element 206 in the first and second sets of test sensing elements 206 may be sensitive in the $B_x$ direction on the plane defined by the surface of sensor die 200. As another example, each test sensing element 206 in the first and second sets of test sensing elements 206 may be sensitive in the $B_y$ direction on the plane defined by the surface of sensor die 200.

Figure 4:
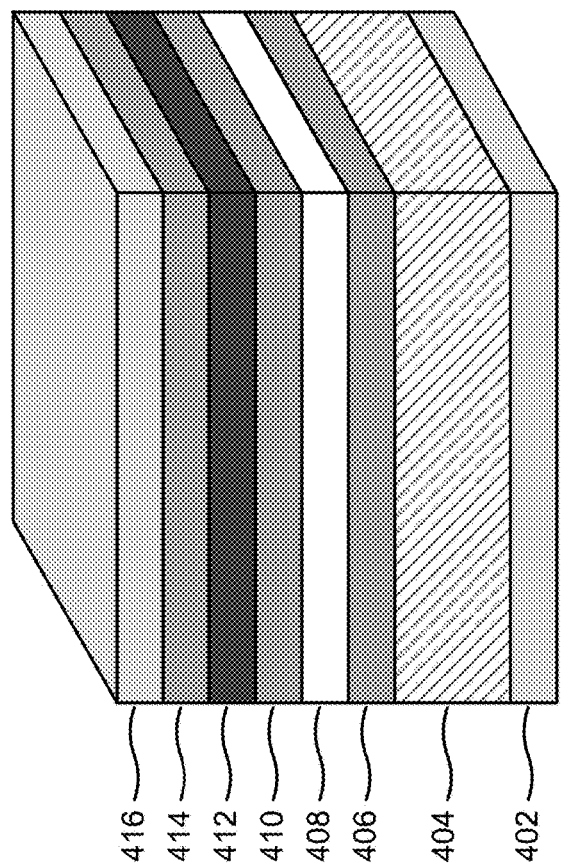
FIG. 4 is a diagram of an example implementation of a sensing element described herein.

In some implementations, to ensure that test sensing element 206 has the same magnetic properties as sensing element 204, a layer stack of test sensing elements 206 may match that of sensing elements 204. In other words, the layer stack of test sensing elements 206 may be a replica of the layer stack of sensing elements 204. Further, test sensing element 206 may be fabricated at a same time and using a same process as sensing element 204. Therefore, test sensing elements 206 of sensor die 200 may be magnetized in the same direction as sensing elements 204 of sensor die 200 (e.g., such that test sensing elements 206 are sensitive in the same direction as sensing elements 204). An example layer stack for sensing element 204 and test sensing element 206 is shown in FIG. 4.

In some implementations (as indicated in FIG. 2A) an in-plane projection of test sensing element 206 may have a smaller area than an in-plane projection of sensing element 204. In other words, an area on the plane of sensor die 200 that is consumed by a given test sensing element 206 may be smaller than an area on the plane of sensor die 200 that is consumed by a given sensing element 204.

Figure 2C:
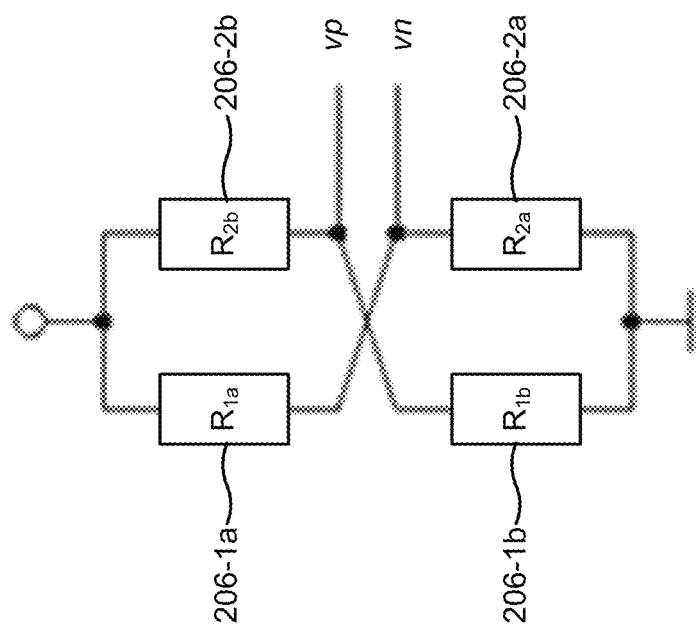
Figure 2D:
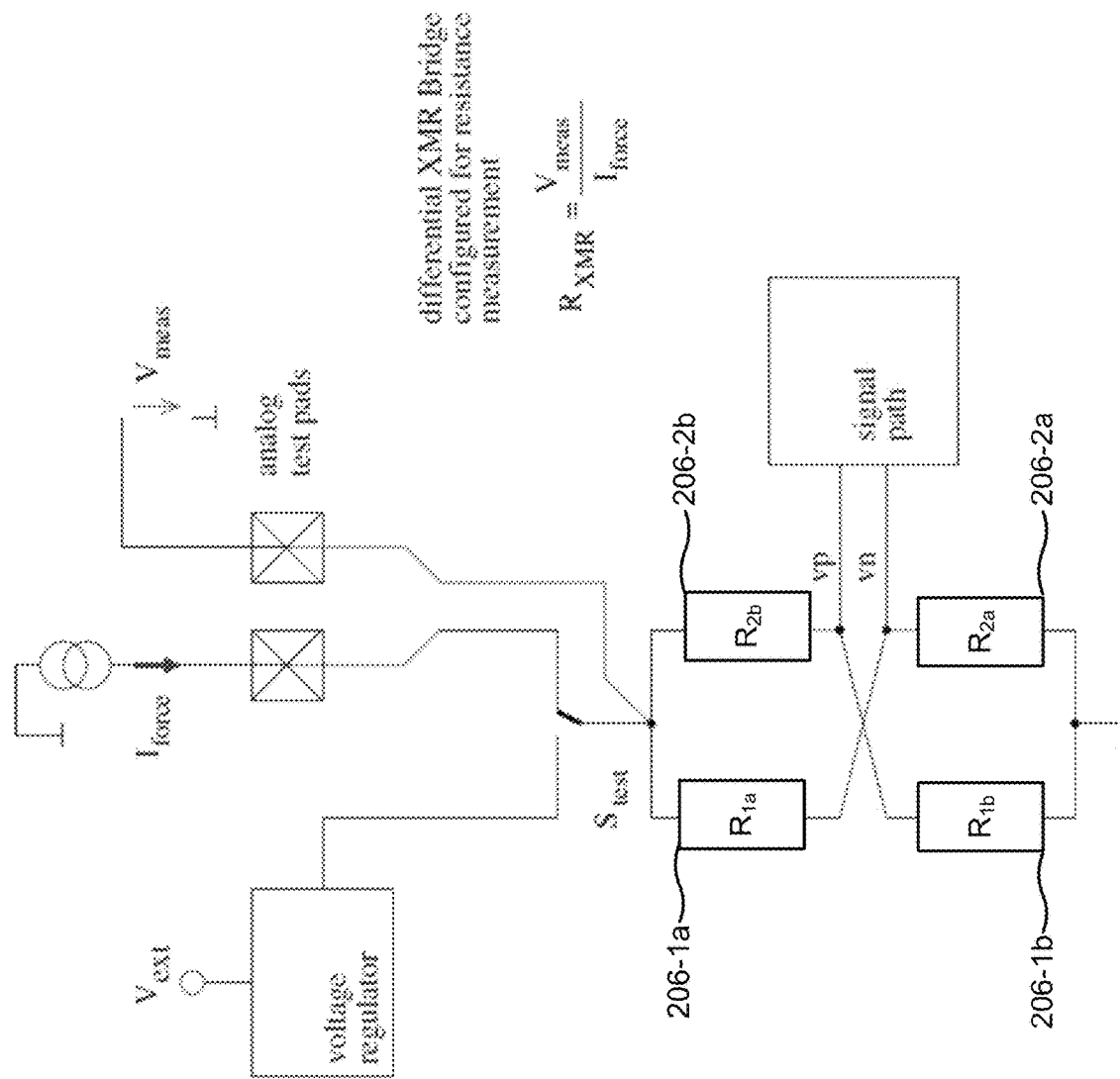

In some implementations, as shown in FIG. 2B, the first set of test sensing elements 206 may include a first pair of test sensing elements 206 (e.g., test sensing elements 206-1a and 206-1b) and the second set of test sensing elements 206 may include a second pair of test sensing elements 206 (e.g., test sensing elements 206-2a and 206-2b). In such a case, the first pair of test sensing elements 206 and the second pair of test sensing elements 206 may be connected in a bridge configuration (e.g., a Wheatstone bridge) or another self-biasing structure, in some implementations. FIG. 2C is a diagram illustrating an example of a bridge configuration that can be used for connecting the first and second pairs of test sensing elements 206. In FIG. 2C, test sensing element 206-1a, test sensing element 206-1b, test sensing element 206-2a, and test sensing element 206-2b are represented as resistors $R_{1a}$, $R_{1b}$, $R_{2a}$, and $R_{2b}$, respectively, in the Wheatstone bridge configuration.

Returning to FIG. 2B, WoC 208 includes a conductive element associated with applying a magnetic field to one or more test sensing elements 206 of sensor die 200. For example, WoC 208 may include a metallic element that conducts a current in association with applying a magnetic field to test sensing elements 206 of sensor die 200.

In some implementations, WoC 208 may include a first section arranged along a direction that is perpendicular to the direction of sensitivity of test sensing elements 206, and a second section arranged along a direction that is parallel to the direction of sensitivity of test sensing elements 206. Here, one set of test sensing elements 206 may be arranged over the first section of WoC 208, while another set of test sensing elements 206 may be arranged over the second section of WoC 208. For example, as shown in FIG. 2B, WoC 208 may include a first section arranged in the $B_y$ direction, and a second section arranged in the $B_x$ direction. As shown, the first set of test sensing elements 206 (including test sensing elements 206-1a and 206-1b) is arranged over the first section of WoC 208, and the second set of test sensing elements 206 (including test sensing elements 206-2a and 206-2b) is arranged over the second section of WoC 208. In some implementations, as illustrated in FIG. 2B, WoC 208 may be formed in an L-shaped arrangement comprising the first section and the second section. That is, in some implementations, WoC 208 may be arranged such that there is a bend of approximately 90 degrees between the first and second sections.

In some implementations, the first set of test sensing elements 206, the second set of test sensing elements 206, and WoC 208 may be arranged such that when current flows through WoC 208, a component of the magnetic field in the first direction is applied to the first set of test sensing elements 206, and a component of the magnetic field in a second direction that is perpendicular to the first direction is applied to the second set of test sensing element 206. Here, an output (e.g., an output voltage) of test structure 202 may be injected into a signal path of sensor die 200 (e.g., such that the magnetic sensitivity of test sensing elements 206 and therefore the magnetic sensitivity of sensing elements 204 can be determined using other application-related circuitry of sensor die 200).

For example, sensing elements 204 and test sensing elements 206 of sensor die 200 may be sensitive in the $B_x$ direction. In such a case, when the current flows through WoC 208, a component of the magnetic field in the $B_x$ direction is applied to the first set of test sensing elements 206, and a component of the magnetic field in the $B_y$ direction is applied to the second set of test sensing elements 206. Here, since the component of the magnetic field applied to the first set of test sensing elements 206 is in the direction of sensitivity of test sensing elements 206 of sensor die 200, a sensor output can be used to measure the magnetic sensitivity of the first set of test sensing elements 206 and, therefore, the magnetic sensitivity of sensing elements 204. Notably, in this example, the component of the magnetic field applied to the second set of test sensing elements 206 is perpendicular to the direction of sensitivity of the second set of test sensing elements 206 (e.g., since the component applied at the second set of test sensing elements 206 is in the $B_y$ direction) and, therefore, the second set of test sensing elements 206 do not sense the $B_y$ component of the magnetic field, meaning that the $B_y$ component of the magnetic field does not impact determination of the magnetic sensitivity of sensing elements 204.

As another example, sensing elements 204 and test sensing elements 206 of sensor die 200 may be sensitive in the $B_y$ direction. In such a case, when the current flows through WoC 208, a component of the magnetic field in the $B_x$ direction is applied to the first set of test sensing elements 206, and a component of the magnetic field in the $B_y$ direction is applied to the second set of test sensing elements 206. Here, since the component of the magnetic field applied to the second set of test sensing elements 206 is in the direction of sensitivity of test sensing elements 206 of sensor die 200, a sensor output can be used to measure the magnetic sensitivity of the second set of test sensing elements 206 and, therefore, the magnetic sensitivity of sensing elements 204. Notably, in this example, the component of the magnetic field applied to the first set of test sensing elements 206 is perpendicular to the direction of sensitivity of the first set of test sensing elements 206 (e.g., since the component applied at the second set of test sensing elements 206 is in the $B_x$ direction) and, therefore, the first set of test sensing elements 206 do not sense the $B_x$ component of the magnetic field, meaning that the $B_x$ component of the magnetic field does not impact determination of the magnetic sensitivity of sensing elements 204.

WoC pad 210 and ground pad 212 (GND 212) are pads associated with conducting current through WoC 208 in association with applying the magnetic field to test sensing elements 206. In some implementations, test structure 202 may only include WoC pad 210, and GND 212 may be a ground pad of sensor die 200.

Figure 2E:
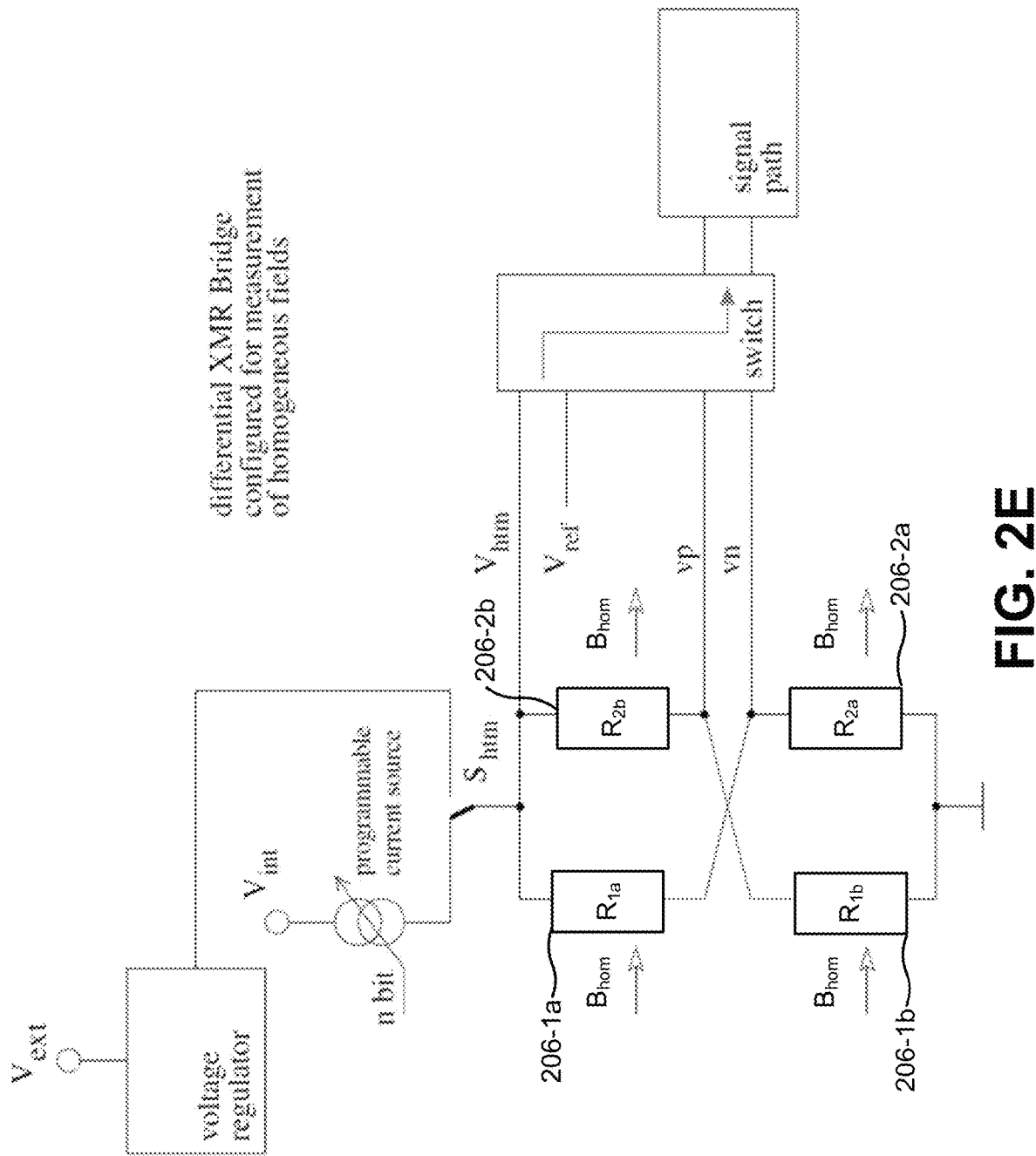

In some implementations, one or more elements of test structure 202 can provide one or more other functions associated with sensor die 200. For example, in some implementations, test structure 202 can be used for measurement of a single ended homogeneous magnetic field (e.g., in a final packaged sensor device when the test pads are no longer accessible from the outside). FIG. 2E is a diagram illustrating an example of implementation of test structure 202 when configured for performing measurement of a homogeneous magnetic field (e.g., a magnetic field having a component in a single only). During operation in a homogeneous test mode, a current is forced into a supply pin of the bridge of test sensing elements 206. When the homogeneous magnetic field (e.g., identified in FIG. 2E as $B_{hom}$) is applied, test sensing elements 206 change their resistance values in the same way (i.e., in an identical manner) with respect to one another, and the supply voltage is proportional to the magnetic field. Because this single ended measurement is sensitive to temperature and process variations, a programmable current source may be used. As shown, the supply voltage $V_{htm}$ and a reference voltage $V_{ref}$ are switched to the differential signal path. Before applying the magnetic field, an output of the differential signal path is calibrated to zero by applying an appropriate programmable current. The supply voltage of the bridge can be assumed to be identical to the reference voltage (e.g., $V_{supply}=I_{bias} \times R_{bridge}$ (1+Sensitivity*$B_{hom}$)→Sensitivity=($V_{supply}/(I_{bias} \times R_{bridge})-1)/B_{hom}$ As another example, WoC 208 of test structure 202 can be arranged for use as a ground connection by another circuit of sensor die 200. As another example, WoC 208 can be arranged for use as a power connection by another circuit of sensor die 200. As still another example, GND 212 of test structure 202 may also serve as a ground pad for sensor die 200, in some implementations.

As indicated above, FIGS. 2A-2E are provided merely as examples. Other examples may differ from what is described with regard to FIGS. 2A-2E. Further, the number and arrangement of elements shown in FIGS. 2A-2E are provided as an example. In practice, there may be additional elements, fewer elements, different elements, or differently arranged elements than those shown in FIGS. 2A-2E. Furthermore, two or more elements shown in FIGS. 2A-2E may be implemented within a single element, or a single element shown in FIGS. 2A-2E may be implemented as multiple, distributed elements. Additionally, or alternatively, a set of elements (e.g., one or more elements) shown in FIGS. 2A-2E may perform one or more functions described as being performed by another set of elements shown in FIGS. 2A-2E.

Figure 3:
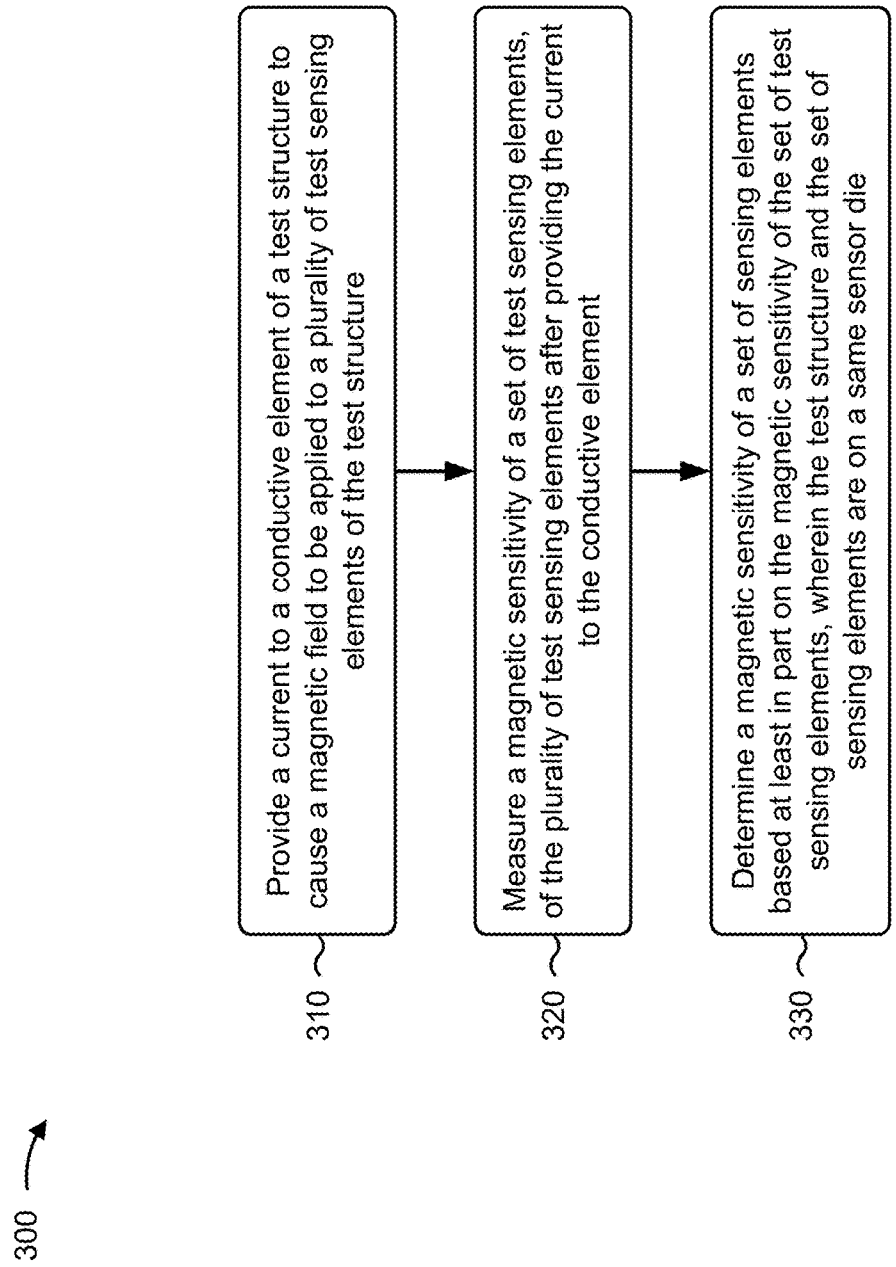
FIG. 3 is a flowchart of an example process associated with determining a magnetic sensitivity of a set of sensing elements using a test structure, as described herein.

FIG. 3 is a flow chart of an example process 300 associated with determining a magnetic sensitivity of a set of sensing elements 204 using test structure 202.

As shown in FIG. 3, process 300 may include providing a current to a conductive element of a test structure to cause a magnetic field to be applied to a plurality of test sensing elements of the test structure (block 310). For example, a current may be provided to WoC 208 of test structure 202 to cause a magnetic field to be applied to test sensing elements 206 of sensor die 200, as described above.

As further shown in FIG. 3, process 300 may include measuring a magnetic sensitivity of a set of test sensing elements, of the plurality of test sensing elements, after providing the current to the conductive element (block 320). For example, a magnetic sensitivity of a set of test sensing elements 206 (e.g., the first set of test sensing elements 206 or the second set of test sensing elements 206) may be measured after providing the current to WoC 208, as described above.

As further shown in FIG. 3, process 300 may include determining a magnetic sensitivity of a set of sensing elements based at least in part on the magnetic sensitivity of the set of test sensing elements (block 330). For example, a magnetic sensitivity of a set of sensing elements 204 may be determined based at least in part on the magnetic sensitivity of the set of test sensing elements 206, as described above.

Process 300 may include additional implementations, such as any single implementation or any combination of implementations described below and/or in connection with one or more other processes described elsewhere herein.

In some implementations, verifying that the magnetic sensitivity of the set of test sensing elements 206 represents the magnetic sensitivity of the set of sensing elements 204 may be needed (e.g., in order to verify that the magnetic sensitivity of the set of sensing elements 204 can be reliability determined based at least in part on the magnetic sensitivity of the set of test sensing elements 206). Thus, in some implementations, process 300 may further include measuring a resistance of the set of test sensing elements 206 and a resistance of the set of sensing elements 204 (e.g., with a force sense test mode), and then determining whether the resistance of the set of test sensing elements 206 matches the resistance of the set of sensing elements 204 (e.g., within a tolerance). Here, verifying that the magnetic sensitivity of the set of test sensing elements 206 represents the magnetic sensitivity of the set of sensing elements 204 may occur when the resistance of the set of test sensing elements 206 matches the resistance of the set of sensing elements 204.

In some implementations, a sensing signal, provided by the set of sensing elements 204, can be adapted based at least in part on the magnetic sensitivity of the set of sensing elements 204. For example, after the magnetic sensitivity of the set of sensing elements 204 is determined in the manner described above (e.g., based at least in part on the magnetic sensitivity of the set of test sensing elements 206), a sensing signal, provided by the set of sensing elements 204, can be adjusted, calibrated, modified, or otherwise adapted based at least in part on the magnetic sensitivity, thereby ensuring reliable and accurate measurements provided by the set of sensing elements 204.

In some implementations, a homogeneous magnetic field can be measured using test structure 202. For example, a test current can be injected to a supply pin of test structure 202, and a then homogeneous magnetic field can be applied to test structure 202. Next, a supply voltage of test structure 202 (after application of the magnetic field) can be measured, and a magnetic sensitivity of test structure 202 can be determined based at least in part on the measured supply voltage.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

FIG. 4 is a diagram of an example implementation of a sensing element 400. In some implementations, sensing element 400 may correspond to sensing element 204 and test sensing element 206. As described above, sensing element 204 and test sensing element 206 may utilize a same layer stack (e.g., to ensure that magnetic characteristics of test sensing element 206 matches that of sensing element 204). As shown in FIG. 4, sensing element 400 may include a seed layer 402, an antiferromagnetic layer 404, a pinned layer 406, an interlayer 408, a reference layer 410, a tunnel junction layer 412, a free layer 414, and a cap layer 416.

As shown, sensing element 400 comprises antiferromagnetic layer 404 formed on seed layer 402. Seed layer 402 may comprise any suitable material allowing a deposition of antiferromagnetic layer 404 thereon. Antiferromagnetic layer 404 may, for example, comprise Platinum Manganese (PtMn), Iridium Manganese (IrMn), and/or Nickel Manganese (NiMn).

Pinned layer 406 may be formed on antiferromagnetic layer 404. In some implementations, pinned layer 406 may comprise a ferromagnetic material, such as Cobalt Iron (CoFe). A magnetic orientation of pinned layer 406 may be determined by antiferromagnetic layer 404.

Interlayer 408 may be formed on pinned layer 406. In some implementations, interlayer 408 may comprise a non-magnetic material, such as Ruthenium (Ru).

Reference layer 410 may be formed on interlayer 408. In some implementations, reference layer 410 comprises a ferromagnetic material, such as CoFe and/or Cobalt Iron Boron (CoFeB).

Tunnel junction layer 412 may be formed on reference layer 410. In some implementations, tunnel junction layer 412 may comprise a non-magnetic material, such as Copper (Cu) or Magnesium Oxide (MgO).

Free layer 414 may be formed on tunnel junction layer 412. Free layer 414 may also be referred to as a sensor layer. In some implementations, free layer 414 may comprise a ferromagnetic material, such as like CoFe, NiFe, CoFeB, or combination of different ferromagnetic materials.

Cap layer 416 may be formed on free layer 414. In some implementations, cap layer 416 may comprise, for example, Tantalum Nitride (TaN).

In operation of sensing element 400, an external magnetic field may change a magnetic orientation of free layer 414 with respect to pinned layer 406 and/or reference layer 410, which changes the resistance of sensing element 400, thereby enabling the functionalities described elsewhere herein.

As indicated above, FIG. 4 is provided merely as an example. Other examples may differ from what is described with regard to FIG. 4. The materials identified above are provided for illustrative purposes, and in other implementations other suitable materials may be used. Further, the number and arrangement of layers shown in FIG. 4 are provided as an example. In practice, there may be additional layers, fewer layers, different layers, or differently arranged layers than those shown in FIG. 4. Furthermore, two or more layers shown in FIG. 4 may be implemented within a single layer, or a single layer shown in FIG. 4 may be implemented as multiple, distributed layers. Additionally, or alternatively, a set of layers (e.g., one or more layers) shown in FIG. 4 may perform one or more functions described as being performed by another set of layers shown in FIG. 4.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "element" is intended to be broadly construed as hardware, firmware, and/or a combination of hardware and software.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A sensor die, comprising:
   a set of sensing elements; and
   a test structure associated with determining a magnetic sensitivity of the set of sensing elements, the test structure including:
      at least one first test sensing element, associated with determining the magnetic sensitivity of the set of sensing elements and that is different from the set of sensing elements, sensitive in a first direction in a plane defined by a surface of the sensor die,
      at least one second test sensing element, associated with determining the magnetic sensitivity of the set of sensing elements and that is different from the set of sensing elements, sensitive in the first direction in the plane defined by the surface of the sensor die, and
      a wire on chip (WoC) associated with applying a magnetic field to the at least one first test sensing element and to the at least one second test sensing element,
         wherein the at least one first test sensing element, the at least one second test sensing element, and the WoC are arranged such that when current flows through the WoC:
            a component of the magnetic field in the first direction is applied to the at least one first test sensing element, and
            a component of the magnetic field in a second direction that is perpendicular to the first direction is applied to the at least one second test sensing element.

2. The sensor die of claim 1, wherein the at least one first test sensing element includes a first pair of test sensing elements and the at least one second test sensing elements includes a second pair of test sensing elements.

3. The sensor die of claim 2, wherein the first pair of test sensing elements and the second pair of test sensing elements are connected in a bridge configuration.

4. The sensor die of claim 1, wherein the WoC includes:
   a first section arranged along a direction that is perpendicular to the first direction in the plane defined by the surface of the sensor die,
      wherein the at least one first test sensing element is arranged over the first section of the WoC, and
   a second section arranged along a direction that is parallel to the first direction in the plane defined by the surface of the sensor die,
      wherein the at least one second test sensing element is arranged over the second section of the WoC.

5. The sensor die of claim 1, wherein the WoC is in an L-shaped arrangement comprising a first section and a second section,
   wherein the at least one first test sensing element is arranged over the first section of the WoC and, wherein the at least one second test sensing element is arranged over the second section of the WoC.

6. The sensor die of claim 1, wherein the set of sensing elements, the at least one first test sensing element, and the at least one second test sensing element are magnetoresistive sensing elements.

7. The sensor die of claim 1, wherein an output voltage of the test structure, associated with determining the magnetic sensitivity of the set of sensing elements, is to be injected into a signal path of the sensor die.

8. The sensor die of claim 1, wherein the test structure further comprises a WoC pad and a ground pad associated with conducting a current through the WoC in association with applying the magnetic field.

9. The sensor die of claim 1, wherein the WoC is arranged for use as a ground connection or a power connection by a circuit of the sensor die.

10. The sensor die of claim 1, wherein an XMR stack of the at least one first test sensing element and the at least one second test sensing element is a replica of an XMR stack of the set of sensing elements.

11. The sensor die of claim 1, wherein the set of sensing elements is arranged in a bridge configuration.

12. The sensor die of claim 1, wherein an in-plane projection of the at least one first test sensing element and an in-plane projection of the at least one second test sensing element have smaller areas than an in-plane projection of a sensing element of the set of sensing elements.

13. A device, comprising:
one or more sensing elements; and
a test structure associated with determining a magnetic sensitivity of the one or more sensing elements, the test structure including:
a first set of test sensing elements, associated with determining the magnetic sensitivity of the one or more sensing elements and that are different from the one or more sensing elements, sensitive in a direction in a plane defined by a sensor die,
a second set of test sensing elements, associated with determining the magnetic sensitivity of the one or more sensing elements and that are different from the one or more sensing elements, sensitive in the direction in the plane defined by the sensor die, and
a conductive element associated with applying a magnetic field to the first set of test sensing elements and to the second set of test sensing elements,
wherein the first set of test sensing elements, the second set of test sensing elements, and the conductive element are arranged such that, when current flows through the conductive element, a component of the magnetic field in the first direction is applied to the first set of test sensing elements, and a component of the magnetic field in a second direction is applied to the second set of test sensing elements,
wherein the second direction is perpendicular to the first direction, and
wherein the conductive element includes a first section arranged along a direction that is perpendicular to the first direction, and a second section arranged along a direction that is parallel to the first direction,
wherein the first set of test sensing elements is arranged over the first section, and
wherein the second set of test sensing elements is arranged over the second section.

14. The device of claim 13, wherein the one or more sensing elements, the first set of test sensing elements, and the second set of test sensing elements are magnetoresistive sensing elements.

15. The device of claim 13, wherein an output voltage of the test structure, associated with determining the magnetic sensitivity of the one or more sensing elements, is to be injected into a signal path of the device.

16. The device of claim 13, wherein the conductive element is arranged for use as a ground connection or a power connection by a circuit of the device.

17. The device of claim 13, wherein the conductive element is a wire on chip (WoC).

18. A method, comprising:
providing a current to a conductive element of a test structure to cause a magnetic field to be applied to a plurality of test sensing elements of the test structure;
measuring a magnetic sensitivity of a set of test sensing elements of the plurality of test sensing elements after providing the current to the conductive element; and
determining a magnetic sensitivity of a set of sensing elements based at least in part on the magnetic sensitivity of the set of test sensing elements,
wherein the test structure and the set of sensing elements are on a same sensor die;
measuring a first resistance of the set of test sensing elements;
measuring a second resistance of the set of sensing elements; and
verifying that the magnetic sensitivity of the set of test sensing elements represents the magnetic sensitivity of the set of sensing elements based at least in part on determining that the first resistance and the second resistance match.

19. The method of claim 18, further comprising:
injecting a test current to a supply pin of the test structure;
applying a homogeneous magnetic field to the test structure after injecting the test current to the supply pin;
measuring a supply voltage of the test structure after applying the homogeneous magnetic field to the test structure; and
determining a magnetic sensitivity of the test structure based at least in part on the measured supply voltage.

20. The method of claim 18, further comprising:
adapting a sensing signal, provided by the set of sensing elements, based at least in part on the magnetic sensitivity of the set of sensing elements.

* * * * *